United States Patent

Hsu et al.

Patent Number: 5,972,777
Date of Patent: Oct. 26, 1999

[54] METHOD OF FORMING ISOLATION BY NITROGEN IMPLANT TO REDUCE BIRD'S BEAK

[75] Inventors: Shun-Liang Hsu, Hsin-Chu; Chia-Ta Hsieh, Tainan, both of Taiwan

[73] Assignee: Taiwan Semiconductor Manufacturing Company, Ltd., Hsin-Chu, Taiwan

[21] Appl. No.: 08/898,973

[22] Filed: Jul. 23, 1997

[51] Int. Cl.$^6$ ................................................. H01L 21/762
[52] U.S. Cl. ........................................... 438/440; 438/443
[58] Field of Search ..................................... 438/440, 443

[56] References Cited

U.S. PATENT DOCUMENTS

| | | | |
|---|---|---|---|
| 4,564,394 | 1/1986 | Bussmann | 148/1.5 |
| 4,965,221 | 10/1990 | Dennison et al. | 437/70 |
| 5,185,284 | 2/1993 | Motonami | 438/244 |
| 5,308,787 | 5/1994 | Hong et al. | 437/70 |
| 5,369,051 | 11/1994 | Rao et al. | 437/69 |
| 5,429,982 | 7/1995 | Chao | 437/69 |
| 5,432,117 | 7/1995 | Yamamoto | 437/69 |
| 5,447,885 | 9/1995 | Cho et al. | 437/70 |
| 5,599,731 | 2/1997 | Park | 437/70 |
| 5,789,305 | 8/1998 | Peidous | 438/439 |

OTHER PUBLICATIONS

VLSI Technology, International Edition, by SMSZE, McGraw–Hill Book Co. pp. 473–474.

*Primary Examiner*—Olik Chaudhuri
*Assistant Examiner*—Daniel H. Mao
*Attorney, Agent, or Firm*—George O. Saile; Stephen B. Ackerman; Rosemary L. S. Pike

[57] ABSTRACT

A new method of local oxidation using nitrogen implant to reduce the growth of a bird's beak is described. An oxide layer is provided over the surface of a semiconductor substrate. A first silicon nitride layer is deposited overlying the oxide layer. An opening is etched through the first silicon nitride layer to the oxide layer where the device isolation region is to be formed. Nitrogen ions are implanted through the oxide layer to form a nitrogen implanted area within the semiconductor substrate within the opening. A second silicon nitride layer is deposited overlying the first silicon nitride layer and the oxide layer within the opening. The second silicon nitride layer is etched away to leave spacers on the sidewalls of the first silicon nitride layer. The oxide layer and the nitrogen implanted area of the semiconductor substrate within the opening are etched away where they are not covered by the spacers. The semiconductor substrate within the opening is oxidized wherein the device isolation region is formed and whereby the nitrogen implanted region underlying the spacers reduces the growth of a bird's beak. The remaining oxide layer, first silicon nitride layer, and spacers are removed completing the fabrication of a device isolation region of an integrated circuit.

14 Claims, 6 Drawing Sheets

METHOD OF FORMING ISOLATION BY NITROGEN IMPLANT TO REDUCE BIRD'S BEAK

BACKGROUND OF THE INVENTION (1) Field of the Invention

This invention relates to the fabrication of integrated circuit devices and more particularly to a method of local oxidation using a nitrogen implant to suppress growth of a bird's beak under field oxide in the fabrication of integrated circuits.

(2) Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, NY, N.Y., c. 1988 by McGraw-Hill Book Co., pp. 473–474. Referring to FIG. 1, a layer of silicon nitride 3 is deposited over a pad oxide 2 overlying a silicon substrate 1. The pad oxide is a thin thermal oxide which allows better adhesion between the nitride and silicon and acts as a stress relaxation layer during field oxide formation. The nitride and oxide layers are etched to leave openings, not shown, exposing portions of the silicon substrate where the local oxidation will take place. The field oxide 6 is grown within the openings and the nitride and pad oxide layers are removed. This completes the local oxidation.

Bird's beak encroachment is a disadvantage of the conventional LOCOS method. Bird's beak encroachment 7 is caused by the lateral oxidation of silicon along the pad oxide under the nitride layer during the high temperature and long time required by the oxidation process. The bird's beak encroachment reduces the size of the active area. This is critical as device sizes continue to shrink and packing density increases.

U.S. Pat. No. 4,965,221 to Dennison et al teaches the use of oxide or polysilicon spacers and recessed etching to reduce bird's beak encroachment. U.S. Pat. No. 5,369,051 to Rao et al teaches the use of a polysilicon layer between the pad oxide and the silicon nitride layers as well as the use of silicon nitride spacers. U.S. Pat. No. 5,432,117 to Yamamoto teaches the use of a thick silicon nitride layer with thinner edges to prevent bird's beak formation.

Other methods include the use of oxidation blocking films. U.S. Pat. No. 5,447,885 to Cho et al discloses the use of a silicon oxidation blocking film, then forming an oxynitride film by nitrification of native oxide. U.S. Pat. No. 5,429,982 to Chao teaches growing an oxide layer in a nitrogen ambient and annealing the oxide layer to form an oxynitride layer which reduces the bird's beak. Co-pending U.S. patent application Ser. No. 08/705,451 (TSMC-96-026) to Tsai et al filed on Aug. 29, 1996 teaches an oxynitrided pad oxide layer to suppress bird's beak.

SUMMARY OF THE INVENTION

A principal object of the invention is to provide an effective and very manufacturable method to locally oxidize the silicon in an integrated circuit.

Another object of the present invention is to provide a method of local oxidation of silicon that will reduce the growth of a "bird's beak."

Yet another object of the present invention is to provide a method of local oxidation of silicon that will reduce the topography of the resulting oxidation region.

In accordance with the objects of this invention, a new method of local oxidation using nitrogen implant to reduce the growth of a bird's beak is achieved. An oxide layer is provided over the surface of a semiconductor substrate. A first silicon nitride layer is deposited overlying the oxide layer. An opening is etched through the first silicon nitride layer to the oxide layer where the device isolation region is to be formed. Nitrogen ions are implanted through the oxide layer to form a nitrogen implanted area within the semiconductor substrate within the opening. A second silicon nitride layer is deposited overlying the first silicon nitride layer and the oxide layer within the opening. The second silicon nitride layer is etched away to leave spacers on the sidewalls of the first silicon nitride layer. The oxide layer and the nitrogen implanted area of the semiconductor substrate within the opening are etched away where they are not covered by the spacers. The semiconductor substrate within the opening is oxidized wherein the device isolation region is formed and whereby the nitrogen implanted region underlying the spacers reduces the growth of a bird's beak. The remaining oxide layer, first silicon nitride layer, and spacers are removed completing the fabrication of a device isolation region of an integrated circuit.

BRIEF DESCRIPTION OF THE DRAWINGS

In the accompanying drawings forming a material part of this description, there is shown:

FIGS. 2 through 9 schematically illustrate in cross-sectional representation a preferred embodiment of the present invention.

DESCRIPTION OF THE PREFERRED EMBODIMENTS

Figure 2:
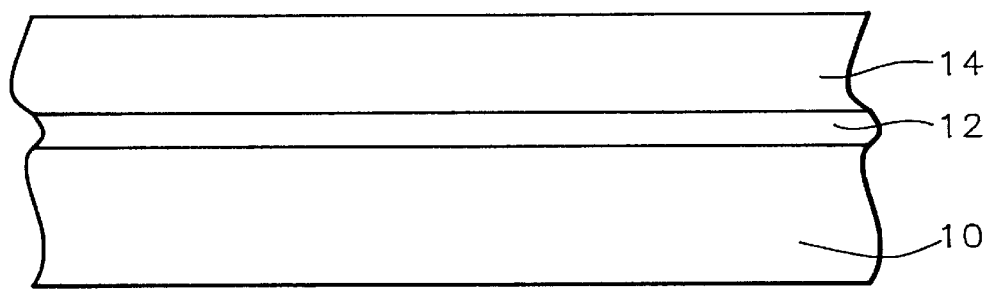

Referring now more particularly to FIGS. 2 through 9, the process of the invention will be described. Referring now to FIG. 2, there is shown a monocrystalline silicon substrate 10. A layer 12 of silicon dioxide is thermally grown at a temperature of about 920°C. on the surface of the substrate to a preferred thickness of between about 150 to 250 Angstroms.

A layer of silicon nitride 14 is deposited over the pad oxide layer to a thickness of between about 1500 to 1700 Angstroms. The silicon nitride layer acts as an oxidation masking layer.

Figure 3:
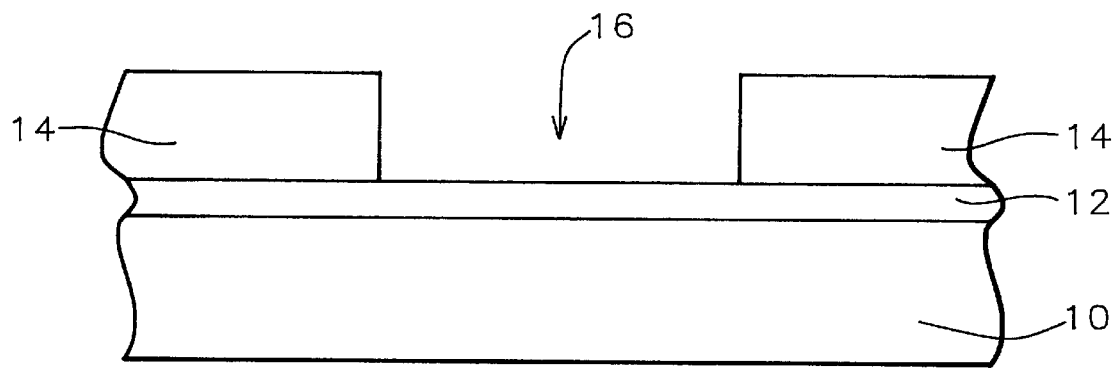

The silicon nitride layer 14 is patterned to leave an opening 16 exposing a portion of the silicon substrate where the local oxidation will take place, as shown in FIG. 3.

Figure 4:
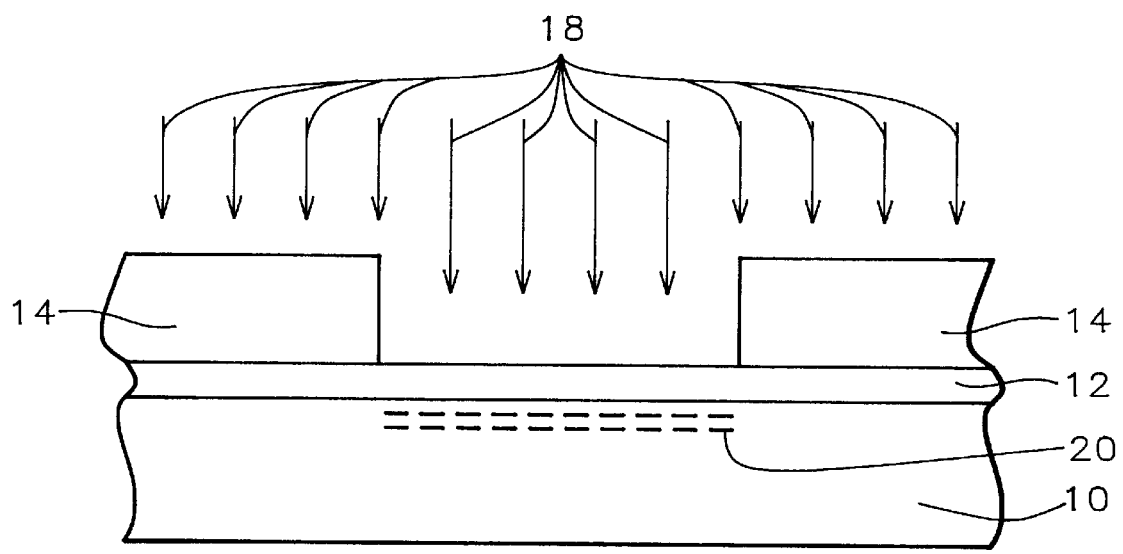

Referring now to FIG. 4, nitrogen ions 18 are implanted through the pad oxide layer into the silicon substrate. The silicon nitride layer 14 acts as an implantation mask. The nitrogen ions are implanted with a dosage of between about 5 E 15 and 9 E 15 atoms/cm$^2$ and an energy of between about 50 and 90 KeV. The nitrogen ions collect within the silicon substrate beneath the opening as illustrated by 20, to a depth of between about 50 and 300 Angstroms.

Figure 5:
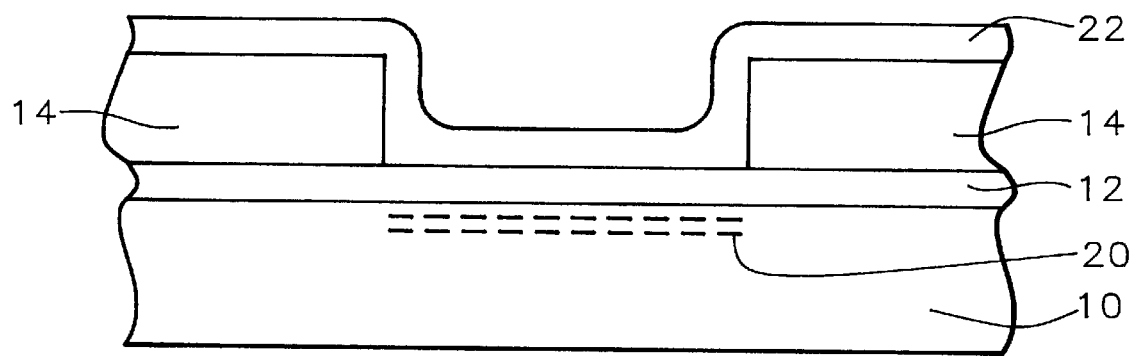
Figure 6:
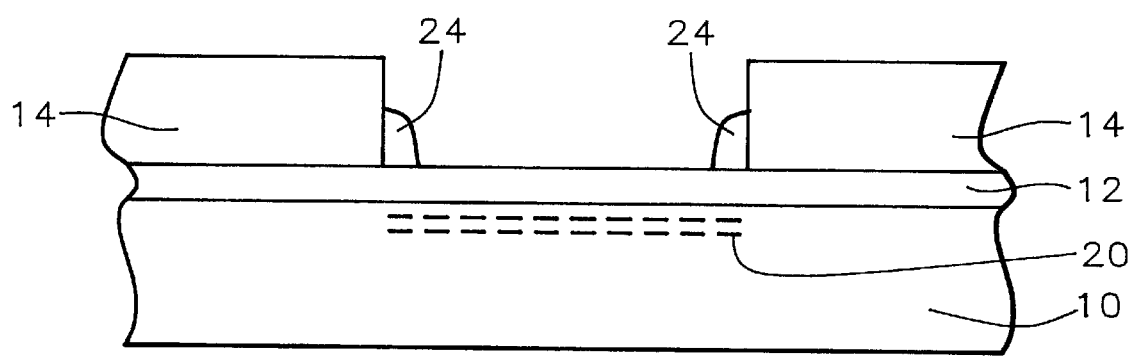

A second layer of silicon nitride 22 is deposited over the substrate and within the opening, as shown in FIG. 5. The second silicon nitride layer 22 is anisotropically etched away to leave spacers 24 on the sidewalls of the first silicon nitride layer 14, as shown in FIG. 6. The spacers may be half the height of the silicon nitride layer 22, or between about 700 and 1200 Angstroms. Conventionally, the higher the height of the spacers, the greater the spacer width, resulting in a decrease in the width of the local oxidation region. If only a short spacer is left, the local oxidation region width is wider. The bird's beak encroachment can be improved with the presence of even a small spacer, as shown in FIG. 6.

Alternatively, layer 22 may be a layer of polysilicon and spacers 24 may be polysilicon spacers. Layer thickness and spacer height are the same as for the silicon nitride spacers.

Figure 7:
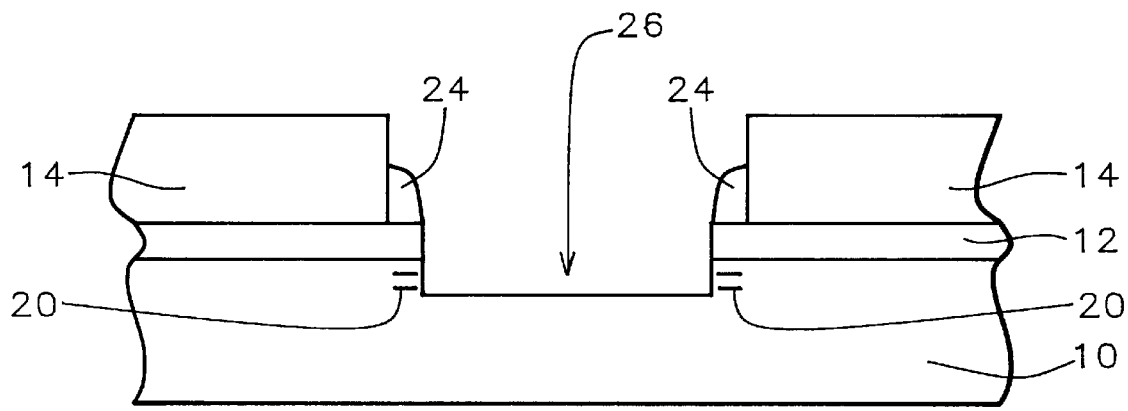

Referring now to FIG. 7, the nitrogen implanted regions 20 within the substrate are etched anisotropically to a depth of between about 300 and 800 Angstroms within the semiconductor substrate, as illustrated by 26. The silicon nitride layer 14 and spacers 24 act as an etching mask. Nitrogen ions 20 remain under the spacers 24.

Next, field oxidation is performed, for example, at a temperature of between about 1000 to 1200° C. for between about 2 to 3 hours in steam. Field oxide region 28 is formed.

Figure 8A:
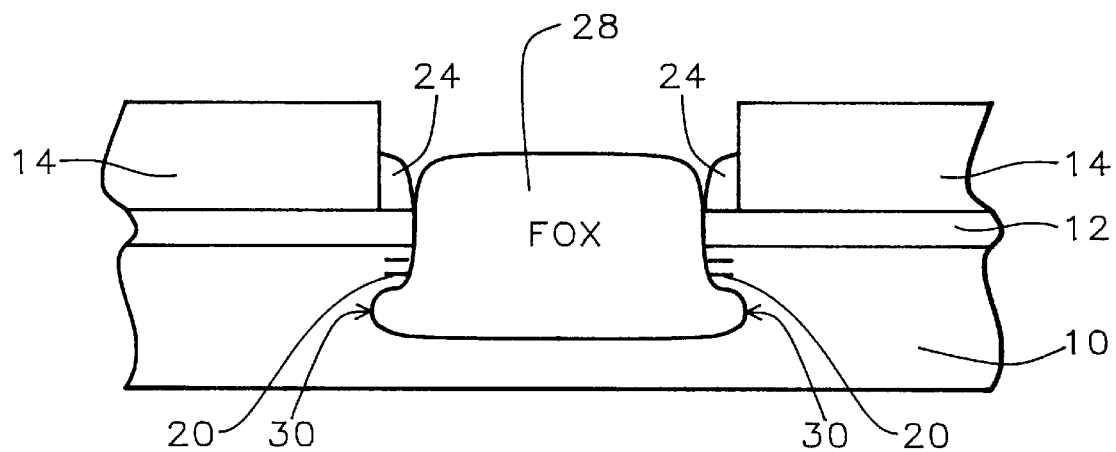
FIGS. 8A and 8B schematically illustrate in cross-sectional representation two alternatives in a preferred embodiment of the present invention.

FIG. 8A illustrates the alternative in which the spacers are of silicon nitride. The nitrogen implanted areas 20 under the silicon nitride spacers 24 impede the growth rate of the field oxide region 28 resulting in smaller bird's beaks 30.

Figure 8B:
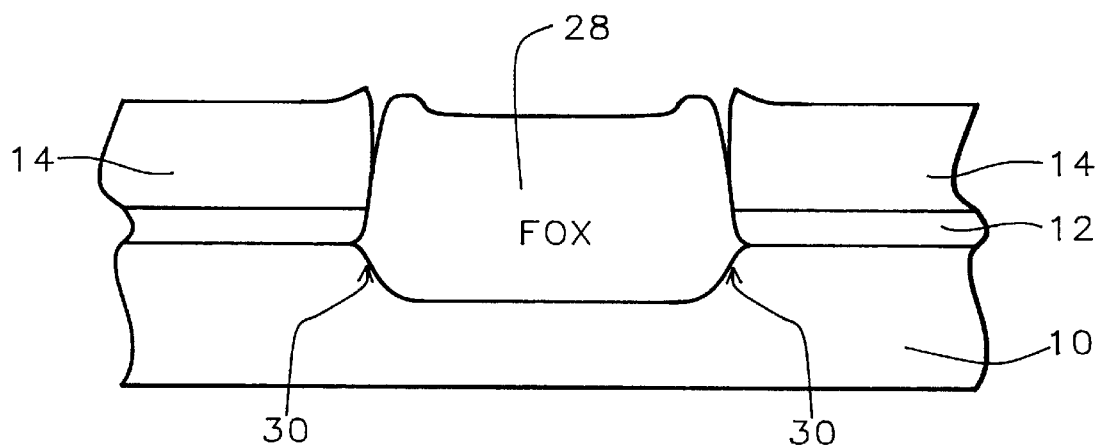

FIG. 8B illustrates the alternative in which the spacers are of polysilicon. The nitrogen implanted areas 20 under the polysilicon spacers 24 impede the growth rate of the field oxide region 28 resulting in smaller bird's beaks 30. The polysilicon spacers 24 are oxidized during field oxidation, resulting in a field oxide region 28 having a less smooth topography than that illustrated in FIG. 8A for the silicon nitride spacer alternative. Both spacer material alternatives result in smaller bird's beaks, because of the slower growth due to the implanted nitrogen ions. However, using silicon nitride spacers will result in a smoother topography of the field oxide region.

Figure 9:
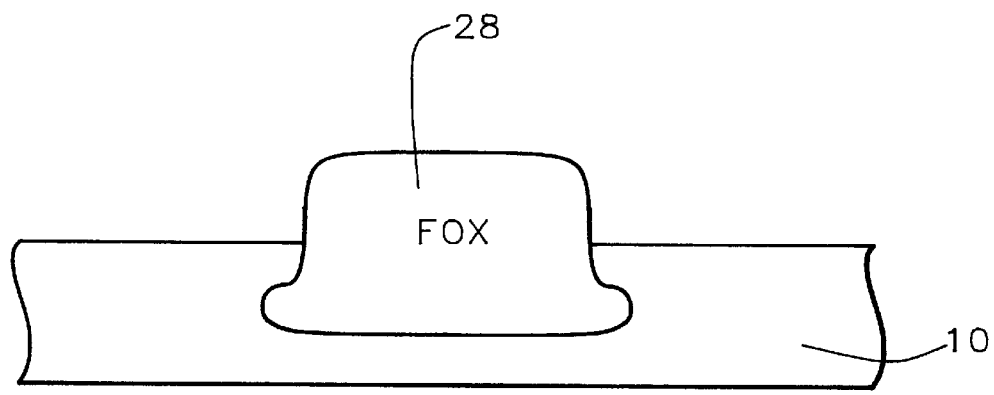

The silicon nitride layer and spacers are removed, such as by hot phosphoric acid and hydrofluoric acid. This completes the local oxidation of the integrated circuit, as shown in FIG. 9. The nitrogen implanted region under the spacers reduces the growth of bird's beaks. The recessed etching reduces the topography of the field oxide region.

EXAMPLE

The following Example is given to show the important features of the invention and to aid in the understanding thereof. Variations may be made by one skilled in the art without departing from the spirit and scope of the invention.

Figure 1:
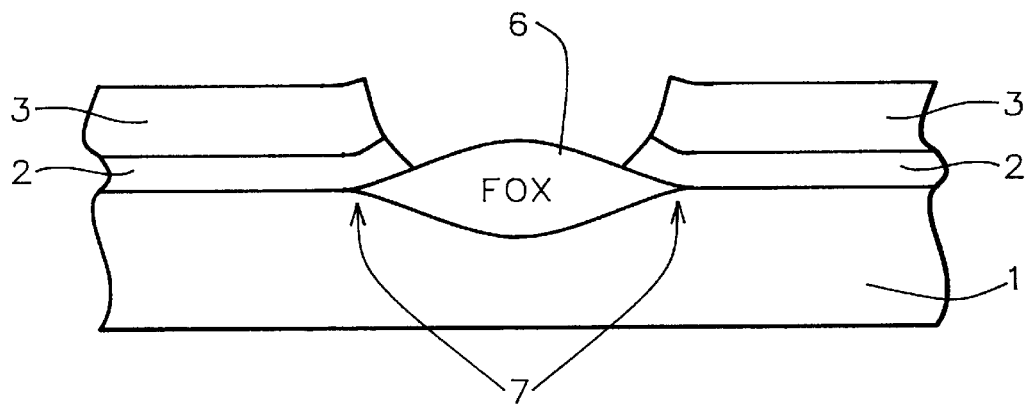
FIG. 1 schematically illustrates in cross-sectional representation a LOCOS process of the prior art.

Field oxidation regions were formed by the process of the present invention and by a conventional process, as illustrated in FIG. 1.

After the integrated circuit devices were completed, the sample wafers were subjected to examination by Scanning Electron Microscope (SEM). The field oxidation region formed by the conventional method had a bird's beak of approximately 550 nanometers in length. The field oxidation region formed by the process of the invention had a bird's beak of approximately 400 nanometers in length, a significant reduction. The samples were also subjected to electrical measurement. The conventional wafer had an effective channel width ($W_{\mathit{eff}}$) measurement of 1.68 $\mu$m while the wafer of the invention had a $W_{\mathit{eff}}$ of 2.05 $\mu$m. The active region of the wafer of the present invention was significantly wider.

Figure 10:
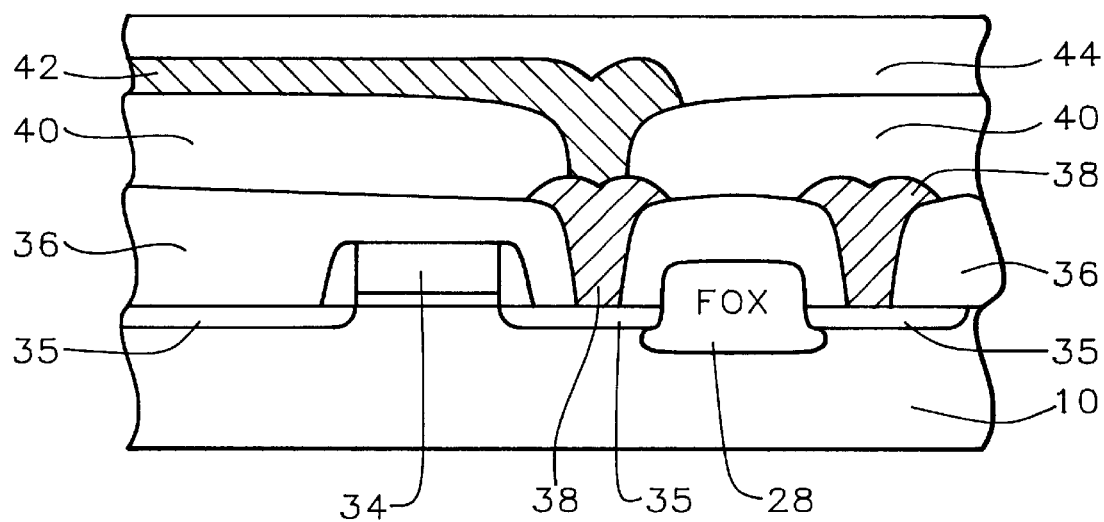
FIG. 10 schematically illustrates in cross-sectional representation a completed integrated circuit of the present invention.

The integrated circuit may be completed as is conventional in the art. For example, referring to FIG. 10, gate electrode 34 and source/drain regions 35 are fabricated as is conventional in the art. Dielectric layer 36, which may be a phosphorus-doped chemical vapor deposited oxide or borophosphosilicate glass (BPSG) is deposited. Contact openings are etched through the dielectric layer to expose the source/drain regions where contacts are desired. Metal layer 38, typically aluminum, is deposited and patterned to complete contacts to the source/drain regions followed by the deposition of an intermetal dielectric layer 40. A second metallization 42 is deposited and patterned. A top capping layer 44 of silicon nitride and/or an oxide completes formation of the integrated circuit.

The process of the present invention provides an effective and very manufacturable method of forming a field oxide region with smaller bird's beak than that of a conventional method. The recessed etching of the silicon substrate provides the additional advantage of reduced topography. Since the field oxide region is recessed into the substrate, planarization in subsequent processes is simpler.

While the invention has been particularly shown and described with reference to the preferred embodiments thereof, it will be understood by those skilled in the art that various changes in form and details may be made without departing from the spirit and scope of the invention.

What is claimed is:

1. The method of forming a device isolation region of an integrated circuit comprising:

providing an oxide layer over the surface of a semiconductor substrate;

depositing a silicon nitride layer overlying said oxide layer;

etching an opening through said silicon nitride layer to said oxide layer where said device isolation region is to be formed;

implanting nitrogen ions through said oxide layer to form a nitrogen implanted area within said semiconductor substrate within said opening;

depositing a polysilicon spacer layer overlying said silicon nitride layer and said oxide layer within said opening;

etching away said polysilicon spacer layer to leave polysilicon spacers on the sidewalls of said silicon nitride layer;

etching away said oxide layer and said nitrogen implanted region of said semiconductor substrate within said opening not covered by said polysilicon spacers;

oxidizing said semiconductor substrate within said opening in a single oxidation step wherein said isolation region is formed and whereby said nitrogen implanted region underlying said polysilicon spacers reduces the growth of a bird's beak; and removing remaining said oxide layer, said silicon nitride layer, and said polysilicon spacers completing the fabrication of said device isolation region of said integrated circuit.

2. The method according to claim 1 wherein said oxide layer is composed of silicon dioxide and has a thickness of between about 150 and 250 Angstroms.

3. The method according to claim 1 wherein said silicon nitride layer has a thickness of between about 1500 and 1700 Angstroms.

4. The method according to claim 1 wherein said implanting of said nitrogen ions is performed at a dosage of between about 5 E 15 and 9 E 15 atoms/cm$^2$ at an energy of between about 50 and 90 KeV and to a depth of between about 50 and 200 Angstroms within said semiconductor substrate.

5. The method according to claim 1 wherein said polysilicon spacer layer has a thickness of between about 500 and 1000 Angstroms.

6. The method according to claim 1 wherein said spacers have a height of between about 700 and 1200 Angstroms.

7. The method according to claim 1 wherein said etching away of said nitrogen implanted region of said semiconductor substrate is done to a depth of between about 300 and 800 Angstroms.

8. The method of forming a device isolation region of an integrated circuit comprising:

providing an oxide layer over the surface of a semiconductor substrate;

depositing a silicon nitride layer overlying said oxide layer;

etching an opening through said silicon nitride layer to said oxide layer where said device isolation region is to be formed;

implanting nitrogen ions through said oxide layer to form a nitrogen implanted area within said semiconductor substrate within said opening;

depositing a polysilicon layer overlying said silicon nitride layer and said oxide layer within said opening;

etching away said polysilicon layer to leave polysilicon spacers on the sidewalls of said silicon nitride layer;

etching away said oxide layer and said nitrogen implanted region of said semiconductor substrate within said opening not covered by said polysilicon spacers;

oxidizing said semiconductor substrate within said opening in a single oxidation step wherein said device isolation region is formed and whereby said nitrogen implanted region underlying said polysilicon spacers reduces the growth of a bird's beak; and removing remaining said oxide layer, said silicon nitride layer, and said polysilicon spacers completing the fabrication of said device isolation region of said integrated circuit.

9. The method according to claim 8 wherein said oxide layer is composed of silicon dioxide and has a thickness of between about 150 and 250 Angstroms.

10. The method according to claim 8 wherein said silicon nitride layer has a thickness of between about 1500 and 1700 Angstroms.

11. The method according to claim 8 wherein said implanting of said nitrogen ions is performed at a dosage of between about 5 E 15 and 9 E 15 atoms/cm$^2$ at an energy of between about 50 and 90 KeV and to a depth of between about 50 and 200 Angstroms within said semiconductor substrate.

12. The method according to claim 8 wherein said layer has a thickness of between about 500 and 1000 Angstroms.

13. The method according to claim 8 wherein said polysilicon spacers have a height of between about 700 and 1200 Angstroms.

14. The method according to claim 8 wherein said etching away of said nitrogen implanted region of said semiconductor substrate is done to a depth of between about 300 and 800 Angstroms.

* * * * *